United States Patent
Fischer et al.

(10) Patent No.: US 6,940,720 B2
(45) Date of Patent: Sep. 6, 2005

(54) INTEGRATED CIRCUIT HAVING A THERMALLY SHIELDED ELECTRIC RESISTOR TRACE

(75) Inventors: Armin Fischer, München (DE); Johann Helneder, Landsham (DE); Heinrich Körner, Bruckmühl (DE); Markus Schwerd, Holzkirchen (DE); Wolfgang Walter, Kaufbeuren (DE); Alexander Von Glasow, Grünwald (DE)

(73) Assignee: Infineon Technologies AG, Munich (DE)

(*) Notice: Subject to any disclaimer, the term of this patent is extended or adjusted under 35 U.S.C. 154(b) by 173 days.

(21) Appl. No.: 10/424,016

(22) Filed: Apr. 25, 2003

(65) Prior Publication Data

US 2004/0011510 A1 Jan. 22, 2004

(30) Foreign Application Priority Data

Apr. 25, 2002 (DE) .......................................... 102 18 530

(51) Int. Cl.⁷ ................................................ H05K 7/20
(52) U.S. Cl. ...................... 361/704; 165/80.2; 257/537; 257/707; 257/713; 257/622; 257/625; 257/659; 361/709; 361/710; 361/718; 361/719; 361/720; 361/722; 361/818

(58) Field of Search .............................. 174/16.3, 35 R, 174/252; 165/80.2, 80.3, 185; 257/706–733, 536–543, 77, 622, 625, 796, 659–660; 361/704–722, 816

(56) References Cited

U.S. PATENT DOCUMENTS

| | | | |
|---|---|---|---|
| 3,710,193 A | * 1/1973 | Greenberg et al. | .......... 361/709 |
| 5,367,284 A | 11/1994 | Morris | |
| 5,955,781 A | 9/1999 | Joshi et al. | |
| 6,236,103 B1 | * 5/2001 | Bernstein et al. | ........... 257/532 |

FOREIGN PATENT DOCUMENTS

DE             43 01 552 A1       7/1994

\* cited by examiner

Primary Examiner—Gregory Thompson
(74) Attorney, Agent, or Firm—Laurence A. Greenberg; Werner H. Stemer; Ralph E. Locher

(57) ABSTRACT

An integrated circuit includes an electric resistor trace, a substrate and a thermally conductive structure arranged above or below the electric resistor trace for dissipating heat from the electric resistor trace to the substrate. The present invention is based on the finding that by introducing the additional thermally conductive structure, despite the introduction of this additional thermally conductive structure requiring space at first, due to the significantly increased heat conductivity to the substrate, a smaller overall chip area for implementing integrated resistors can be obtained.

16 Claims, 2 Drawing Sheets

INTEGRATED CIRCUIT HAVING A THERMALLY SHIELDED ELECTRIC RESISTOR TRACE

BACKGROUND OF THE INVENTION

1. Field of the Invention

The present invention relates to integrated circuits and, in particular, to the heat transfer from an electric resistor trace of the integrated circuit to the substrate.

2. Description of Prior Art

In semiconductor industry, resistors are increasingly integrated in integrated circuits as passive elements. These resistors are required to be firstly very precise, secondly as small as possible and thirdly they are required not to heat up themselves and the surrounding traces and systems beyond a specified range of temperature.

In order to meet these requirements, resistors presently used in integrated circuits have large-area dimensions or take up a large chip area, respectively, so that the heat can be readily dissipated downwards to the substrate usually made of silicon. Due to the increasing miniaturization in the field of integrated circuits these space requirements must be reduced.

The problem of heat dissipation is aggravated by the fact that in industry, due to the high requirements for the precision of the integrated resistors, the integration of these resistors in polysilicon which, due to its vicinity to the substrate material silicon, has a good heat dissipation to the substrate, is given up and for example more precise TaN metal resistors having a larger spatial distance to the silicon are adopted so that the heat dissipation to the substrate is considerably worse.

Consequently, there is a demand for a heat dissipation concept for resistor traces in integrated circuits which satisfies the high requirements for precision, miniaturization and temperature.

SUMMARY OF THE INVENTION

It is the object of the present invention to provide an integrated circuit having an electric resistor trace, in which a reduced chip area and an increased resistor precision can be obtained with a simultaneous monitoring or improvement of the thermal stress.

In accordance with an aspect of the present invention this is achieved by an integrated circuit comprising an electric resistor trace, a substrate, and a thermally conductive structure arranged above and below the electric resistor trace for controlling the temperature of the electric resistor trace.

The present invention is based on the finding that the former "passive" heat dissipation concept in which the heat dissipation is essentially set via the area of the electric resistor trace must be abandoned in order to enable a reduction of the chip area and/or a higher resistor precision with a simultaneous monitoring or improvement of the thermal stress. According to the present invention, this is made possible by arranging a thermally conductive structure above and/or below the resistor trace in order to effectively influence the resistor trace in thermal aspects—in a "passive" way for cooling or in an "active" way for setting the resistance via the temperature.

The present invention is especially based on the finding that a small overall chip area for implementing integrated resistors can be obtained by introducing an additional thermally conductive structure arranged above or below the resistor trace for dissipating heat from the resistor trace to the substrate, despite introducing this additional thermally conductive structure requiring space at first, due to an essentially increased thermal conductivity to the substrate.

According to an embodiment of the present invention, an integrated circuit of a multilayer structure includes an electric resistor trace arranged above the substrate of the integrated circuit and overlapped by a structured area in an upper metallization layer above the resistor trace, which in turn is connected to a metal crosspiece formed in the direction of the multilayer structure towards the substrate and by this is coupled to the substrate in a heat conducting way in order to effectively dissipate the heat to the substrate emitted by the resistor trace to the structured area. In this way, the temperature of the resistor trace is reduced for the purpose of increasing the reliability and the area above the structured area of the upper metallization layer is shielded from the heat dissipated by the resistor trace and can be used in the layout of the integrated circuit for routing and arranging other elements. Put differently, due to the thermal shielding in traces which may cross the resistor trace in, for example, a higher metallization layer, no unallowed temperature stress which may lead to reliability problems or conductivity changes is caused. Due to the more effective shielding, the lateral chip area required can be reduced significantly with an otherwise constant resistance.

In a similar way, a metallization layer below the resistor trace or a structured region of it, respectively, is used to improve the thermal conductivity from the resistor trace to the substrate. According to a special embodiment, this lower metallization layer is separated from the lower side of the resistor trace by a thin gap, such as, for example, a distance of less than 200 nm, which is, for example, defined via a thickness of an electrically insulating silicon dioxide layer arranged therebetween.

According to another aspect of the present invention, the metal structure can be coupled to means for setting the temperature of the metal structure to set an operating temperature for the resistor trace. In this way, a defined and constant resistance can be set, whereby the precision of the integrated circuit can be increased. By increasing or decreasing the temperature of the cooling body or the metal structure, respectively, in a controlled way, it is also possible to adjust or regulate for example the resistance value of the resistor implemented by the resistor trace in a certain range of values using the temperature coefficient of the resistor trace material.

It is an advantage of the present invention that, based on the same metal structure, a shielding from high-frequency electrical fields can be obtained simultaneously to the thermal shielding. This high-frequency radiation shielding applies to both electrical fields acting from outside by surrounding electrical elements or external radiation sources outside the integrated circuit and electrical fields maybe generated by the resistor which are not to be radiated to the exterior in order to avoid other parts of the integrated circuit to be affected.

Further preferred embodiments of the present invention are the subject matter of the sub-claims.

BRIEF DESCRIPTION OF THE DRAWINGS

Preferred embodiments of the present invention will be detailed subsequently referring to the appended drawings, in which.

DESCRIPTION OF PREFERRED EMBODIMENTS OF THE INVENTION

Figure 1:
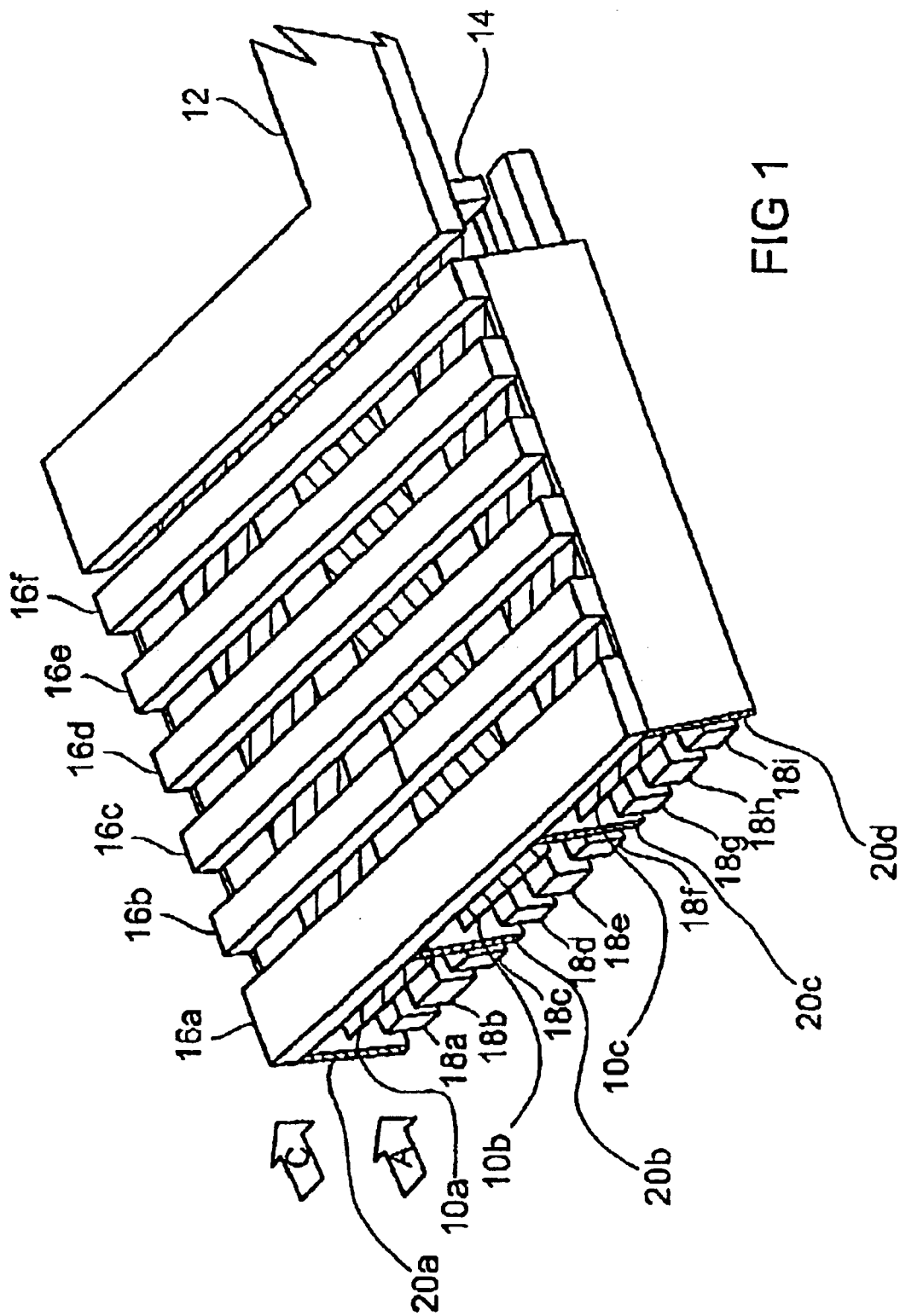
FIG. 1 shows an embodiment of a metal structure for heat dissipation from a resistor trace to a substrate according to an embodiment of the present invention.

Before embodiments of the present invention will be discussed in detail referring to the Figures, it is to be pointed out that, when referring to the different drawings, similar elements are provided with the same reference numerals and that a repeated description of these elements will be omitted.

FIG. 1 shows a stereoscopic image illustrating three resistor traces 10a, 10b and 10c connected in parallel to an electric resistor as well as their pertaining metal structure for thermally shielding same and for dissipating the heat produced by them to a substrate of an integrated circuit in which they are integrated according to an embodiment of the present invention.

For reasons of clarity the substrate is not illustrated in FIG. 1 and is directly below the structures illustrated. FIG. 1 illustrates only one end of the resistor traces 10a, 10b and 10c and consequently only one connecting trace or lead 12 connected via a via 14 to the end illustrated in FIG. 1 of each resistor trace 10a–10c which extends laterally over all the resistor traces 10a–10c. It is to be pointed out that in FIG. 1 only the metal structures and the resistor traces 10a to 10c are illustrated and that, for reasons of illustration, an insulating material of the integrated circuit arranged between these structures, such as, for example, silicon dioxide, is not shown. In addition, the integrated circuit may include further elements and resistor traces not shown in FIG. 1, which thus only illustrates a section of the integrated circuit.

The resistor traces 10a–10c are preferably made of TaN, but can also comprise any other material, such as, for example, polysilicon. The resistor traces 10a–10c are structured in the form of strips of a layer of the resistor material. The resistance of an individual resistor trace 10a–10c is determined depending on the area resistance ρ of the resistor material, the resistor trace width b and the resistor trace length 1 to R=ρ·1/b, R being the resistance of the resistor trace and the area resistance ρ in turn depending on the thickness d of the resistor trace in an essentially inversely proportionate way.

As can be clearly seen in FIG. 1, the resistor traces 10a to 10c illustrated in FIG. 1 in a hatched way for distinguishing from the metal structures, in contrast to conventional integrated resistor traces, are surrounded by metal structures which do, however, not serve for the electric function of the integrated circuit, such as, for example, the connecting trace 12 and the via 14. Conventionally, the guidance of the traces below or above a resistor trace, due to the influence caused by the heat produced there on the electric features of these traces has either been avoided or the resistor trace has been extended laterally in the area such that the heat dissipation via the silicon dioxide to the substrate has been sufficient in order to keep the developing temperature increase at a bearable degree and to dissipate the developing thermal energy to the substrate quickly enough.

The metal structures of FIG. 1 serving to dissipate heat to the substrate include several structured areas in metallization layers which are otherwise used in the multilayer structure of the integrated circuit for trace connections. The order of the layers and, in particular, the relative arrangement of the substrate, the resistor trace layer and the metallization layers depend on the manufacturing process selected of the integrated circuit.

In the present embodiment, two metallization layers are shown, of which one is the metallization layer in which the connecting trace 12 is formed and is arranged above the resistor traces 10a–10c or further away from the substrate, respectively. This metallization layer is generally illustrated in FIG. 1 by an arrow C. A further metallization layer illustrated by an arrow A is arranged between the substrate and the resistor trace layer.

The metal structures of FIG. 1 serving for a thermal shielding and a heat dissipation to the substrate, respectively, include, in the metallization layer C, several bars 16a, 16b, 16c, 16d, 16e and 16f extending laterally to the longitudinal direction of the resistor traces 10a–10c over the resistor traces 10a–10c to cross them and, in the metallization layer A, bars 18a, 18b, 18c, 18d, 18e, 18f, 18g, 18h and 18i extending below the metal traces 10a–10c in parallel to the longitudinal direction thereof. The metal bars 16a–16f residing in the metallization layer C are, for reasons of heat coupling, connected to the substrate via metal crosspieces 20a, 20b, 20c and 20d which extend downwards over essentially the entire length of the resistor traces 16a–16f past the side of them downwards from the bars 16a to 16f along the direction of the multilayer structure. When manufactured, the metal crosspieces 20a–20d are for example produced from stacked via and metallization layer trenches filled with a corresponding metal, as is illustrated in FIG. 1.

Alternatively, the heat dissipation from the bars 16a to 16f towards the substrate could also be realized past the resistor lines by individual vias, such as, for example, by one per bar or one for all the bars, which is connected to the bars 16a–16f via a common bar.

After having described the arrangement of the structures, the functioning of the metal structures serving for a thermal shielding and their advantages will be described subsequently.

During operation, the resistor traces 10a–10c and their surroundings heat up. The thermal energy or heat, respectively, absorbed by the metal bar 16a–16f arranged above the resistor traces 16a–16f, due to a good thermal conductivity of the metal, is conducted downwards via the metal crosspieces and walls 20a–20d, respectively, past the resistor traces 10a–10c in the direction of the substrate, where the thermal energy is dissipated downwards to the substrate. For this, the metal crosspieces 28a–28d are, for example, directly connected to the substrate or end slightly above the substrate separated from the substrate by a thin insulation layer. It has shown that, due to this thermal heat dissipation to the substrate, the region of the integrated circuit above the bars 16a–16f experiences a significantly lower temperature increase due to the resistor traces, since the heat produced by them is effectively dissipated to the substrate. For this reason, even heat-sensitive elements and structures can be arranged above the bars 16a–16f. Conversely, with an equal temperature increase of the surroundings in the integrated circuit, the lateral dimensions of the resistor traces implementing a resistance can be smaller although in this case the thermal energy concentration is higher, since the heat dissipation to the substrate is increased. The heat energy dissipated to the substrate is in turn, as is conventional in technology, dissipated to the surroundings of the integrated circuit by suitable measures, such at, for example, by cool bodies, the air flow of ventilators or the like.

Studies have shown that with a predetermined maximally allowed temperature increase of the exterior surroundings, a structural area reduction around the factor of 2 . . . 10 can usually be obtained due to the metal bars 16a–16f, the arrangements of which will sometimes be referred to as "heat pipe", wherein in the quantity given above the area required for the metal structures for a thermal shielding has been taken into consideration.

The bars 18a–18i arranged below the resistor traces 10a–10c increase the effective heat conductivity between the resistor traces 10a–10c and the substrate.

It is to be mentioned that it has been assumed in FIG. 1 that the metallization layer A is arranged directly above the substrate separated from the substrate by an insulation layer. Otherwise, i.e. when there are further layers between the metallization layer A and the substrate and the distance between the bars 18a–18i is thus greater, vias connected to the bars 18a–18i could be provided towards the substrate to dissipate the heat absorbed by the bars 18a–18i to the substrate.

Another advantageous effect of the metal structures comprising the bars 16a–16f, the metal crosspieces 20a–20d and the bars 18a–18i is a shielding of high-frequency electrical fields to, for example, the GHz area, i.e. of both those fields acting on the resistor traces 10a–10c from the exterior and those radiated to the exterior from the resistor traces 10a–10c. In this way, an electromagnetic decoupling of the resistor traces 10a–10c from the rest of the integrated circuit is obtained. Despite the bar structure gaps in the micrometer range, the heat pipe is at the same time a perfect shielding from long wavelength electromagnetic fields.

It is to be pointed out referring to FIG. 1 that the illustrated metal structure for thermally shielding only illustrates one special embodiment and that the design and arrangement of it can also be selected to be different. In particular, a multilayer structure and thus metallization layers are not required necessarily. The presence of the strip-formed arrangement of the bars 16a–16f and 18a–18i is of advantage, in particular regarding the manufacturing of the metallization layers since, due to this arrangement, the occurrence of elevations and recesses, respectively, a so-called dishing, in the final polishing is avoided during the manufacturing of the individual metallization layers, whereby, after polishing, a smooth surface for a further manufacturing for the other layers of the integrated circuit is ensured. The structures 16a–16f and 18a–18i illustrated as bars can, for example, in the case of not-too-wide structures for insensitive processes, of course, also be formed as a full or partial area, respectively, such as, for example, a full area continuous polygon, which further increases the efficiency of the improvements aimed at.

Figure 2:
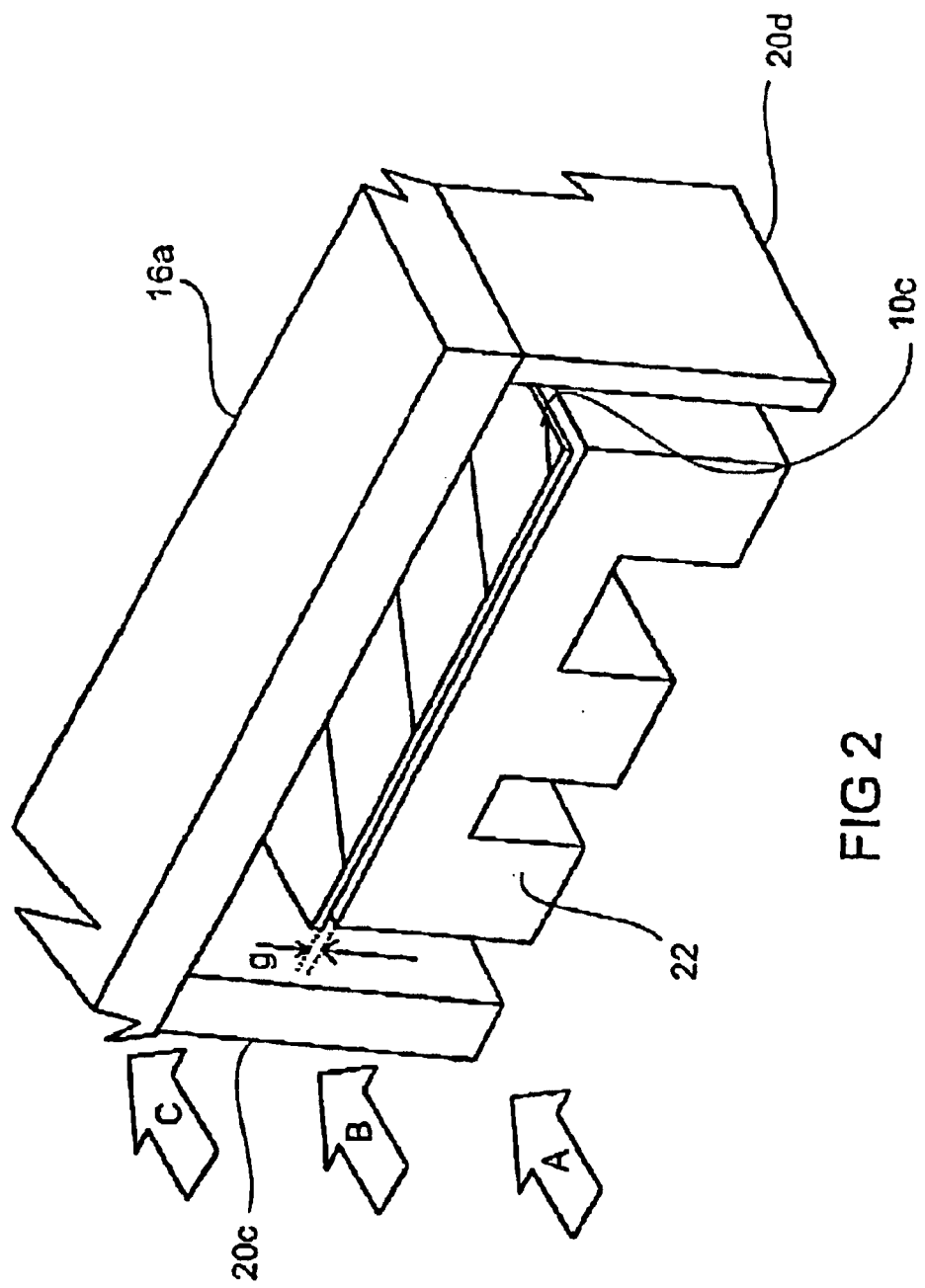
FIG. 2 shows a section of a metal structure for heat dissipation according to a second embodiment.

Referring to FIG. 2, a second embodiment of the present invention will be detailed, which only differs from the one shown in FIG. 1 by the fact that in a further metallization layer B arranged between the metallization layer A and the resistor trace layer, a structured metal region laterally identical to the resistor trace is provided, which is connected to the metal bars in the metallization layer A via via trenches in order to jointly yield a metal structure 22. The metallization layer B is thus removed from the resistor trace layer over a small distance g, g, for example, being less than 200 nm.

Due to the small distance, the effect of the heat dissipation to the substrate is significantly increased by these structures below the resistor traces. The area reduction of the first embodiment mentioned before can, for example, be improved by a further factor of 4 using the second embodiment, when a distance g of 100 nm is used instead of the otherwise usual distance between metallization layers.

Referring to FIG. 2, it is to be mentioned that although the cooling effect is the larger, the closer the metal structure 22 is to the heat-generating resistor trace 10, since the heat resistance between them decreases by this, the distance g cannot be minimized without limits. The distance g is limited in the downward direction by the increasing breakdown danger between resistor trace and metal structure.

Finally, it is to be mentioned referring to FIG. 2 that the metal structure 22, independently of the upper metal structures 16a–16f, can also be used for cooling alone.

It is also to be mentioned that according to an aspect of the present invention the inventive metal structures, such as, for example, the ones shown above, can also be used to adjust or regulate the resistance defined by the resistor traces 10a–10c using or utilizing, respectively, the temperature independency of the specific resistance of the trace material. For this, the metal structures of FIGS. 1 and 2, for thermally shielding, are, for example, able to be coupled or are connected, respectively, to an external heat reservoir fixedly adjusting the temperature of this metal cooling structures to a desired operating temperature, whereby a more constant operation of the circuit can be realized, which in turn may lead to an increase in the precision and maybe the reliability of the integrated circuit as regards the functioning. Alternatively, an electric heater regulated to a constant temperature or an integrated heater, respectively, can be integrated or built in, respectively, such as, for example, below or above the resistor trace 10a–10c. In powering up when the integrated circuit has not yet reached its operating temperature, undesired effects during the warm up phase of the resistor traces may be avoided in this way by, for example, pre-adjusting the resistor trace in a warm up phase in advance to the operating temperature. Even adaptations to different ambient temperatures are feasible.

By increasing and decreasing this desired temperature, such as, for example, by coupling the metal structure to a respective heat reservoir among heat reservoirs having different temperatures, the resistance formed by the resistor traces 10a–10c can be changed, which, in turn, could be used for calibrating an analog circuit. This implementation of a variable integrated resistance, in turn, requires a reduced chip area.

Each temperature-controlled device can be used as a temperature reservoir, such as, for example, a microfluidic system having a condensation and a re-condensation cooling circuit, a heating circuit, such as, for example, with a heating coil, a micropump and a valve switching between the two circuits to switch a common microfluidic channel section thermally coupled to the metal structure in one of the two circuits.

Finally, put differently, the present invention for the first time in microelectronics provides cool bodies integrated on a chip for stabilizing the temperature budget of elements. The embodiments described show area-minimized high-stress precision TaN resistors the temperatures and the thermal effects of which on the surrounding structures are monitored by suitable metal envelope structures. The complete sheathing described in the previous embodiments by the heat pipes provides for an excellent dissipation of the thermal energy absorbed above the resistor traces down to the substrate, which, in turn, means a significant reduction of the resistance. The metal crosspieces at the sides, which, for example, have a thickness of 0.6 μm, and the metal bars can be kept at a temperature increase of less than 5 degrees Kelvin, whereby traces can consequently be led via the TaN resistor without an extensive thermal impairment with effects on stress migrations, electromigration and resistance changes taking place. Due to the cooling of the resistor traces, even the end of the resistor trace can be kept at a temperature increase of less than 5 degrees Kelvin, which, for reasons of electromigration, is of particular importance for the vias to the connecting traces.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An integrated circuit comprising:
an electric resistor trace;
a substrate; and
a thermally conductive structure arranged above and below the electric resistor trace for controlling the temperature of the electric resistor trace;
wherein the thermally conductive structure includes a structured metal area of a metallization layer of a multilayer structure and a metal crosspiece connected to the structured metal area and formed from there in a direction of the multilayer structure to the substrate to couple the structured metal area to the substrate in a heat-conductive way, and wherein the thermally conductive structure is arranged in such a way that it does not accept an electrical function of the integrated circuit except as an electromagnetic shielding.

2. The integrated circuit according to claim 1, wherein the thermally conductive structure is overlapped by the electric resistor trace over a large area.

3. The integrated circuit according to claim 1, wherein the thermally conductive structure is coupled to the substrate in a heat-conductive way.

4. The integrated circuit according to claim 1, wherein several electric resistor traces are connected in parallel to form an electric resistor of the integrated circuit with a predetermined resistance.

5. The integrated circuit according to claim 1, wherein the resistor trace is made of TaN.

6. The integrated circuit according to claim 1, wherein the thermally conductive structure is a metal structure.

7. The integrated circuit according to claim 6, wherein the metal structure is arranged in such a way that an electromagnetic shielding of the electric resistor trace from the exterior and with respect to the exterior is provided.

8. An integrated circuit, comprising:
an electric resistor trace;
a substrate; and
a thermally conductive structure arranged above and below the electric resistor trace for controlling a temperature of the electric resistor trace;
wherein the thermally conductive structure is adapted to dissipate heat from the electric resistor trace to the substrate.

9. The integrated circuit according to claim 8, wherein the thermally conductive structure includes a structured metal area of a metallization layer of a multilayer structure.

10. The integrated circuit according to claim 9, wherein the structured metal area comprises bars spaced apart in the longitudinal direction and crossing the electric resistor trace laterally to a longitudinal direction of the electric resistor trace.

11. The integrated circuit according to claim 8, wherein the thermally conductive structure is arranged in such a way that it does not accept an electrical function of the integrated circuit.

12. An integrated circuit, comprising:
an electric resistor trace;
a substrate; and
a thermally conductive structure arranged above and below the electric resistor trace for controlling a temperature of the electric resistor trace;
wherein the thermally conductive structure includes a structured metal area of a metallization layer of a multilayer structure;
wherein the thermally conductive structure further comprises a metal crosspiece connected to the structured metal area and formed from there in the direction of the multilayer structure to the substrate to couple the structured region to the substrate in a heat-conductive way.

13. The integrated circuit according to claim 12, wherein the metal crosspiece has a via or a stack of trenches filled with a metal.

14. An integrated circuit, comprising:
an electric resistor trace;
a substrate; and
a thermally conductive structure arranged above and below the electric resistor trace for controlling a temperature of the electric resistor trace;
wherein the thermally conductive structure includes a structured metal area of a metallization layer of a multilayer structure;
wherein the structured metal area is formed as a full area polygon.

15. An integrated circuit, comprising:
an electric resistor trace;
a substrate; and
a thermally conductive structure arranged above and below the electric resistor trace for controlling a temperature of the electric resistor trace;
wherein the thermally conductive structure includes a structured metal area of a metallization layer of a multilayer structure;
wherein the metallization layer is arranged in a distance below the electric resistor trace, which is smaller than 200 nm.

16. An integrated circuit, comprising;
an electric resistor trace;
a substrate; and
a thermally conductive structure arranged above and below the electric resistor trace for controlling a temperature of the electric resistor trace;
wherein the thermally conductive structure can be coupled thermally to means for adjusting the temperature of the thermally conductive structure to adjust an operating temperature for the electric resistor trace.

* * * * *